United States Patent
Tsuchinaga

(10) Patent No.: US 6,785,074 B2
(45) Date of Patent: Aug. 31, 2004

(54) PREAMBLE PATTERN AND MAGNETIC RECORDING SYSTEM USING THE PATTERN

(75) Inventor: Hiroyuki Tsuchinaga, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 372 days.

(21) Appl. No.: 10/038,833

(22) Filed: Jan. 8, 2002

(65) Prior Publication Data

US 2003/0011920 A1 Jan. 16, 2003

(30) Foreign Application Priority Data

Jul. 10, 2001 (JP) ........................................ 2001-208681

(51) Int. Cl.$^7$ .............................. G11B 5/09; G11B 5/02

(52) U.S. Cl. .............................. 360/39; 360/31; 360/53; 360/51; 360/55; 360/65; 360/46; 360/48

(58) Field of Search .............................. 360/39, 31, 53, 360/51, 46, 55, 65, 40, 48, 42

(56) References Cited

U.S. PATENT DOCUMENTS 5,258,933 A 11/1993 Johnson et al.
5,552,942 A 9/1996 Ziperovich et al.

FOREIGN PATENT DOCUMENTS

JP 8-315517 11/1996
JP 2000-21096 1/2000

*Primary Examiner*—David Hudspeth
*Assistant Examiner*—Natalie Figueroa
(74) *Attorney, Agent, or Firm*—Antonelli, Terry, Stout & Kraus, LLP

(57) ABSTRACT

When jitter-like noise is prominent, sampling-phase control and amplitude control in a preamble pattern region is affected. It is possible to reduce effects of jitter-like noise without increasing the length of the preamble pattern. By altering a preamble pattern from that of a conventional 4T-cycle to 6T-cycle or over, amplitude data at a peak point of a reproduced signal, which is less affected by jitter-like noise, is utilized. Thus, the stability of the amplitude control can be improved. As to the phase control, a shift of the sampling timing is estimated by sample data of one cycle of the preamble pattern, and an acquisition procedure of the timing control is made faster.

9 Claims, 13 Drawing Sheets

PREAMBLE PATTERN AND MAGNETIC RECORDING SYSTEM USING THE PATTERN

BACKGROUND OF THE INVENTION

The present invention relates to a data-reproducing. System for digital recording and reproducing devices using the PBML signal-processing technique, such as hard disk drives. More specifically, the present invention relates to a preamble pattern for initial acquisition in AGC and PLL processing in front end processing and to an initial acquisition procedure using the preamble pattern.

The conventional magnetic-recording channel is of the so-called longitudinal recording system type. According to this system, information is recorded in the form of plus magnetization and minus magnetization arranged parallel to the recording surface. Various pieces of information are recorded on magnetic disk media of the longitudinal recording system type in accordance with a format such as is shown in FIG. 14. The servo pattern is provided in a region to record a bit pattern for tracking and addressing, which is used to position the magnetic head. The magnetic head records and reproduces data based on the bit pattern. A gap is inserted after the servo pattern to cope with a variation of the rotation of the disk, and a data-sector follows the gap. The data sector is a region where a certain pattern called a "preamble" is recorded repeatedly. By referring to this region, initial acquisition by an AGC circuit and a PLL circuit is carried out. Thereafter, information of a synchronization pattern (SYNC) is read, and the data is reproduced.

In the recording format of a hard disk drive, the preamble region is indispensable for reproducing data, but the provision of this preamble region is one of the factors reducing the data efficiency; accordingly, it is preferable to keep the preamble region as small as possible. A number of methods have been proposed from various viewpoints to control the amplitude and timing accurately, using as small a number of bits as possible.

In U.S. Pat. No. 5,258,933, there is disclosed a technique for making use of a zero-cross comparator to convert a signal reproduced from a preamble into binary codes. A zero-cross timing pulse is obtained by the zero-cross comparator, and this timing pulse is fed to a VCO to stop its oscillation for a certain time. Then the VCO resumes oscillation one half of the duration of one bit after the next zero-cross timing pulse. Thus, the phase shift between the reproduced signal and the VCO clock is reduced to almost zero to shorten the time necessary for phase acquisition.

U.S. Pat. No. 5,552,942 discloses another technique. According to this technique, the phase of a VCO clock is optimally controlled by calculating the mean square errors of expected values and actual values of samples of a known preamble pattern.

Japanese Patent Laid-Open No. 315517/1996 discloses a technique for expanding the capture range to ±T (T is the duration of one bit) as effective measures in case the SN (signal-to-noise) ratio of the preamble pattern goes down.

According to the conventional timing-controlling method, a timing gradient is calculated from the amplitude value X(k) at the k-th sampling point and the judged value r(k) of X(k) by using the following expression:

$$\Delta\tau(k) = -4(k-1) \cdot X(k) + r(k) \cdot X(k-1)$$

and the timing of the VCO clock is renewed so as to converge the result to zero. The ideal capture range is ±T/2.

However, if r(k) is judged erroneously due to noise, the timing gradient may exceed the capture range of ±T/2, elongating the time necessary for phase acquisition. To prevent it, r(k) is not judged at every sampling point, but is predicted by making use of the periodicity of the preamble pattern. If the preamble pattern is of a 4T cycle, r(k) has the repetition of (+1, +1, −1, −1); therefore, the timing gradient at every second sampling point is given by the expression below.

$$\Delta\tau(k) = X(k) - X(k-2)$$

Japanese Patent Laid-Open No. 21096/2000 discloses a technique to obtain a timing clock for sampling by-using a preamble pattern which is not of a 4T cycle. This technique relates to the PR5 equalization system, which is suitable to magnetic-recording channels for reproducing data of a single-layer perpendicular-recording medium with a ring head. A timing clock for sampling is obtained by using a preamble pattern consisting of repetition of a magnetization pattern of "+1, +1, +1, −1, −1, −1" in PBML processing, wherein a single-layer perpendicular-recording medium and a ring head are combined with the PR5 system.

The development of a perpendicular-recording system has been accelerating recently, and there is a good possibility that most media will shift from the longitudinal recording system to the perpendicular-recording system because the latter is suitable to high-density recording.

Unlike the longitudinal recording channel which shows band-pass filter characteristics, the response of reproduced signals of a perpendicular-recording medium has a spectrum in a low-frequency area adjacent to DC, and it is known that the waveform responding to isolated transition of perpendicular magnetization can be well approximated by the hyperbolic tangent function tanh (x).

Due to improvement of the recording density and of the reproduction sensitivity by GMR heads and so on in recent magnetic systems, there is a tendency for the noise arising from recording media to become more salient than the noise arising from the circuits of systems. An example of the medium noise is jitter-like noise due to the variation of the transition point in magnetization. As the jitter-like noise becomes predominant over the system noise, which is white noise, it becomes difficult to improve the performance of hard disk drives of the PRML that make making use of a spectrum of lower frequency.

Desirable in a perpendicular magnetic recording system, wherein a perpendicular-recording two-layer medium and a single magnetic-pole head are combined, is the PR(1, 1) system, the PR(1, 2, 1) system, or the PRML system, which is based on the former two systems, and wherein equalization is effected according to the nature of the noise on the channel and data is demodulated by an ML, each system being capable of using the spectrum in the low-frequency area effectively. In this case, the provision of means for controlling timing~ and amplitude to sample a reproduced signal at proper timing and amplitude is indispensable.

The most simple method of accomplishing the above is as follows. A reproduced signal with a spectrum of lower frequency and a differentiated signal obtained by differentiating the reproduced signal are prepared. The timing for sampling is controlled and the gain is adjusted by applying a circuit of initial acquisition by a conventional 4T-cycle preamble pattern to the differentiated signal, and the reproduced signal with a spectrum of lower frequency is sampled with a phase-controlled clock. In the case of this method, it is necessary to provide means for switching between the reproduced signal with a spectrum of lower frequency and the differentiated signal, as well as a means for correcting the relative time difference between the reproduced signal with a spectrum of lower frequency and the differentiated signal.

If there is heavy jitter-like noise due to variation of the point of magnetization transition, the amplitude levels at sampling points fluctuate to cause large errors in computed timing and amplitude gradients. There are four sampling points in one cycle of a 4T-cycle preamble. If white noise is added to it, averaging can be effected four times a cycle, and hence the variance of timing gradients-is reduced to $1/\sqrt{4}=\frac{1}{2}$. On the other hand, because jitter-like noise is caused by the displacement of the point of magnetization transition, both the former two sampling points and the latter two sampling points are saliently correlated and tend to move at a level in the same direction; accordingly, averaging can be effected only two times a cycle in substance. Thus, if jitter-like noise is predominant over white noise, the errors of computed timing and amplitude gradients are difficult to reduce. If the loop gain is set high at an early stage of acquisition to reduce the time necessary for the acquisition in such a channel, the set values of the VCO and the VGA may be affected considerably when the loop gain is switched to another value. In this case, if the loop gain is switched to the former value, the acquisition does not. finish in the remaining part of the preamble; therefore, the loop gain can not be set high in acquisition, which makes the acquiring time long, increases the number of bits to be allotted to the preamble pattern, and reduces the data efficiency.

In the case of the technique of zero-phase start disclosed in the U.S. Pat. No. 5,552,942, because the mean square error has to be calculated a number of times by changing the timing of sampling to find a timing which gives a minimum mean square error, a large number of bits have to be allotted to the preamble pattern.

In the case of the technique of extracting a clock for the correct timing of sampling by using a 6T-cycle preamble pattern disclosed in the Japanese Patent Laid-Open No. 2000-21096, the effects of jitter-like noise are not dealt with. Because signals after equalization by the PR5 system are used and a magnetic-recording channel with band-pass filter characteristics similar to the PR4's characteristics is assumed, it is difficult to reduce the number of bits to be allotted to the preamble.

The above two techniques deal with the extraction of the timing clock, but do not deal with the effects of~!jitter-like noise in amplitude adjustment.

SUMMARY OF THE INVENTION

A first object of the present invention is to provide (i) a preamble pattern to reduce the effects of jitter-like noise in timing and amplitude control which is indispensable in a signal-processing technique for perpendicular-recording hard disk drives using magnetic-recording media with a spectrum of lower frequency, and (ii) an acquisition system using the preamble pattern.

A second object of the present invention is to provide a signal-processing system which (i) prevents a transitional response from occurring in the reproduced signal when the reproduced signal is switched from a DC-erased state to the preamble pattern while the DC component is being removed from a reproduced signal with a spectrum of lower frequency by using a high-pass filter, and (ii) makes effective use of the spectrum of lower frequency.

A third object of the present invention is to provide (i) a preamble pattern to reduce the effects of jitter-like noise in timing and amplitude control of hard disk drives using longitudinal magnetic-recording media, and (ii) an acquisition system using the preamble pattern.

Jitter-like noise is caused by random displacement of the point of magnetization transition. As shown in FIG. 16, a waveform responding to isolated magnetization transition of a perpendicular-recording magnetic channel with a lower-frequency spectrum can be approximated by the hyperbolic tangent function, and a reproduced signal of any pattern can be obtained by superposing response waveforms on one another. When the point of isolated magnetization transition is displaced forward or backward, the nearer the sampling point is to the transitional point, the larger the amplitude change is. This is apparent from the differentiated waveform of the response waveform. To avoid the effects of jitter-like noise, it is effective to use amplitude data obtained at points speed from the transitional point. In the case of a conventional 4T-cycle preamble,-sampling points (●) 0.5T away from the transitional point are used; accordingly, the effects of jitter-like noise are large in the timing and amplitude control. If sampling points (○) 1.5T away from the transitional point can be used, the differential values are reduced to a fifth, reducing the effects of jitter-like noise significantly. On the other hand, as shown in FIG. 18, the waveform responding to isolated magnetization transition of the conventional longitudinal magnetic-recording channel can be approximated by the Lorentz waveform, and a reproduced signal of any pattern can be obtained by superposing, response waveforms on one another. The amplitude change at the time of the isolated transitional point being displaced forward or backward is spaced a maximum of 0.5T to 1.0T away from the transitional point. This is apparent from the differentiated waveform of the response waveform. To reduce the effects of jitter-like noise, it is effective to avoid the peak area of the differentiated waveform and use the amplitude data obtained at the transitional point. In the case of a conventional 4T-cycle preamble, amplitude data at the points (○) 0.5T away from the transitional point are used; accordingly, the effects of jitter-like noise are large in the timing and amplitude control. If amplitude data at the sampling point (●) whose phase is the same as the phase of. the transitional point can be used, the effects of jitter-like noise are reduced significantly.

The first aspect of this invention for solving the above problems relates to a magnetic-recording channel with a spectrum of lower frequency. According to this aspect, amplitude data to be obtained at sampling points spaced 1.5T or more away from the point of magnetization transition of a −6T or longer-cycle preamble pattern are used. At the sample points, the differential values of amplitude are small, and hence, the amplitude changes due to a certain phase shift of sampling are relatively small; therefore, stable amplitude control can be accomplished if amplitude gradients for amplitude control are computed at the sampling points. In addition, because the amplitude reaches its peak at the sampling points, the amplitude gradients are maximum at the sampling points though samples per one cycle are few in number; therefore, acquisition can be completed in a short time.

The second aspect of this invention for solving ,the above problems relates to a magnetic-recording channel with a spectrum of band-pass filter characteristics. According to this aspect, sampling is carried out at the point of magnetization transition and the amplitude data obtained by the sampling is used. At æ the sample point, the differential value of amplitude is small, and hence, the amplitude change due to a certain phase shift of sampling is relatively small; therefore, stable amplitude control can be accomplished if the amplitude gradient for amplitude control is computed at the sampling point. In addition, because the amplitude reaches its peak at the sampling point, the amplitude gradient is maximum at the sampling point though samples per one cycle are few in number; therefore, acquisition can be completed in a short time.

According to the third aspect of this invention for solving the above problems, sampling is carried by a VCO clock signal sent out at a predetermined phase, the phase error is computed by using the amplitude data obtained by the sampling, the phase shift between the VCO clock signal and the reproduced signal of the preamble pattern is estimated, and the phase of the VCO is adjusted optimally, instead of setting the loop gain high and completing the acquisition in a short time.

To be more specific, sampling points are set in at least, one cycle of the preamble pattern by initial phase setting of the VCO. The timing gradient at each sampling point is computed to search for a sampling point for initiating a zero-phase start. Applied to the computation of timing gradients is the prior art disclosed in the Japanese Patent Laid-Open No. 315517/1996 of enlarging the phase-capture range by making use of the periodicity of a preamble pattern. After the search of the point for initiating a zero-phase start, the absolute value of the phase difference at the initiating point is estimated by using the timing gradients at the other sampling points too. And, the phase of the VCO was adjusted at a time based on the estimated value. The prior art disclosed in the Japanese Patent Laid-Open No. 249752/1996 was improved to estimate the phase difference. By applying the improved art to timing gradients having the same periodicity as the preamble pattern, the phase difference is estimated from the magnitudes of computed timing gradients at the sampling points. In the case of the zero-phase start system of the present invention, the initial phase adjustment is completed by sampling one cycle of the preamble pattern and adjusting the phase of the VCO once; therefore, the system does not require many preamble patterns. After the initial phase adjustment, a feedback loop using usual timing gradients is started at a low loop gain. Thus, although a phase error due to jitter-like noise remains in the initially adjusted phase of the VCO, acquisition can be started with a minimum phase error. Because the loop gain in acquisition can be set low enough, taking jitter-like noise into account, the problem of the jitter-like noise causing the phase of the VCO to vary can be solved.

To attain the above second Object, a DC-free pattern, such as a 4Tor shorter-cycle pattern, is recorded in a region between a servo pattern and a data sector.

DESCRIPTION OF THE PREFERRED EMBODIMENT

First Embodiment

A hard disk drive with a two-layer medium taken as an present invention will perpendicular-recording magnetic medium representing a first embodiment of the present invention will be explained by way of example.

Figure 1:
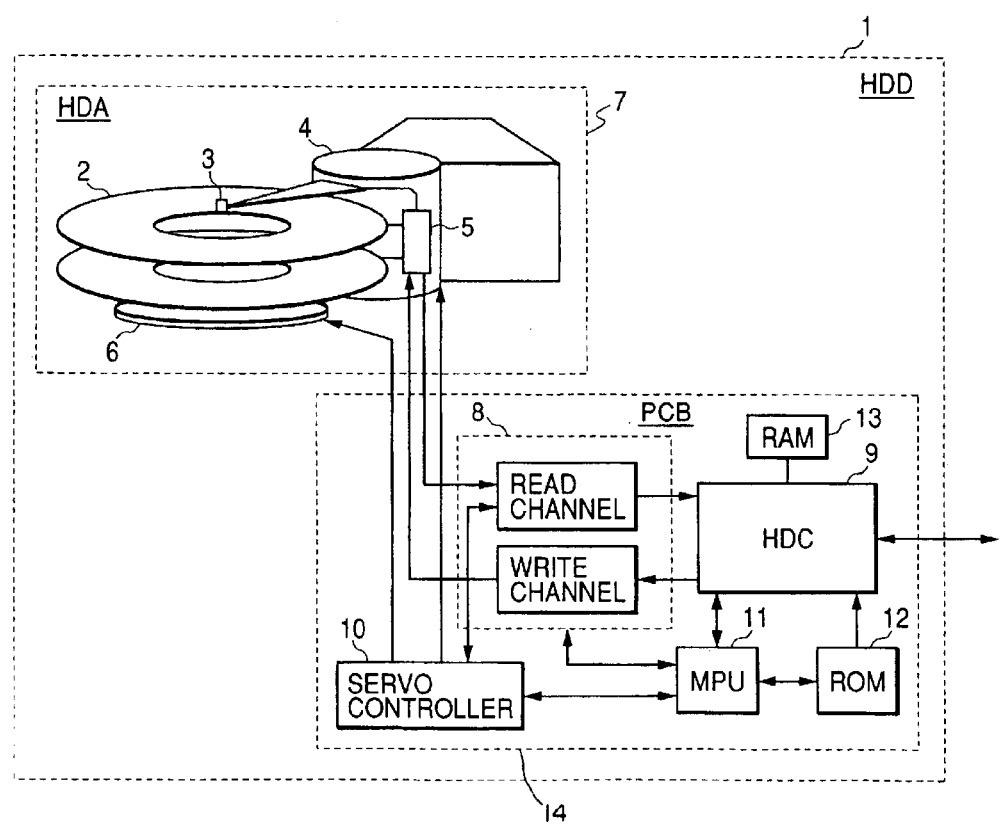
FIG. 1 is a block diagram of a hard disk drive according to an embodiment of the present invention.

FIG. 1 shows a general configuration of the hard disk drive (HDD) 1. The HDD 1 comprises a head assembly (HAD) 7 and a package board (PCB) 14. The HAD 7 includes a two-layer perpendicular-recording magnetic disk 2, a single-magnetic-pole magnetic head 3, a carriage 4, a R/W-IC 5 mounted on the carriage 4, and a spindle motor 6. The PCB 14 includes a read-write channel 8, a hard-disk controller 9, a servo-control circuit 10, a micro processor 11, a ROM 12, a RAM 13, etc. The read-write channel 8 includes a write channel to record data and a read channel to reproduce data. The PRML (Partial Response Maximum Likelihood) system suitable for high-density recording has recently come into use as a data-reproducing system.

The read channel of the PRML system comprises an AGC circuit, a low-pass filter (LPF), an A/D converter (ADC), an equalizer (FIR), a Viterbi decoder (ML), and a PLL circuit. The AGC and PLL circuits take data with predetermined amplitude as samples from a reproduced analog signal fed from the R/W-IC at a correct timing on the basis of a synchronizing clock and feeds the samples to the FIR and the ML.

The AGC circuit detects the deviation from target amplitude based on the amplitude of samples taken by the ADC and controls the gain of a variable-gain amplifier (VGA).

The PLL circuit detects the deviation of the sampling timing based on the amplitude of samples taken by the ADC and feeds back the deviation to a variable phase oscillator. (VCO) to control the phase shift between the sampling clock and the reproduced analog signal.

Figure 2:
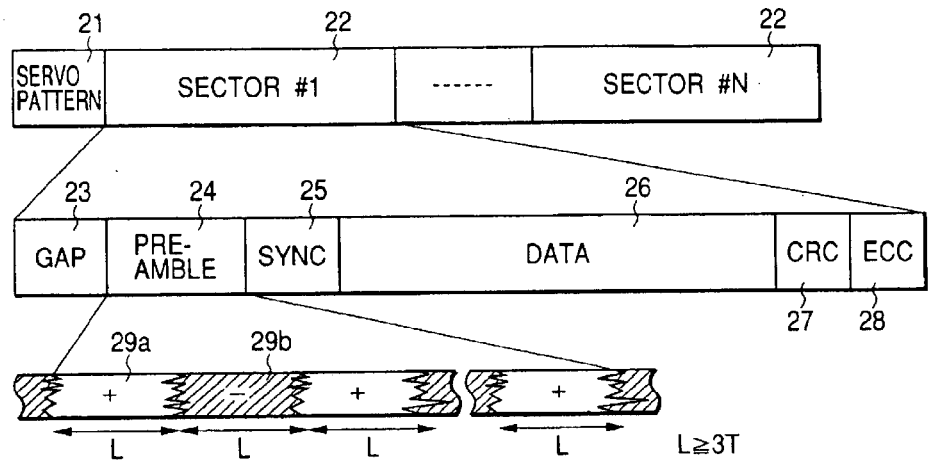
FIG. 2 is a diagram which shows a recording format according to an embodiment of the present invention.

Servo patterns 21 are arranged on the magnetic disk and a sector 22 follows each servo pattern 21 in accordance with the format shown in FIG. 2. Each sector 22 includes a gap 23, a preamble 24, a SYNC 25, data 26, a CRC 27, and an ECC 28. Each preamble 24 includes alternating L-long upward-magnetization sections 29a and L-long downward-magnetization sections 29b. The length, "L," of each magnetization section is 3T or longer, "T" being the duration of one bit. Thus, the preamble pattern is the repetition of a 6T or longer cycle. In the description below, "L" is assumed to be "3T".

Recorded in the gap 23 is a 1T—1T or shorter-cycle magnetized pattern. This magnetized pattern is recorded throughout the data region 26 when a servo pattern is recorded in the servo region 21; accordingly, the DC level of the reproduced signal output from the magnetic head stabilizes and the transitional response of the waveform due to the cutoff of the lower-frequency spectrum by a high-pass filter can be held down.

In accordance with the present invention, the linear recording density is assumed to be a normalized linear recording density K of 1.0 or more. The normalized linear recording density is the time necessary for the amplitude to change from −0.5 to +0.5 (the saturated amplitude is assumed to be ±1.0) in a waveform responding to the isolated magnetization transition divided by the duration T of one bit. When the normalized linear recording density K is 1.0, the resolution of the most-dense repetition pattern of 1T—1T is 10%.

In the following description, it is assumed that the spindle motor is rotating the magnetic disk, the positioning servo movement of the magnetic head has been executed, and the system is ready to reproduce data. The hard-disk controller 9 and the micro processor ii feed various control signals necessary for reproducing data.

Figure 3:
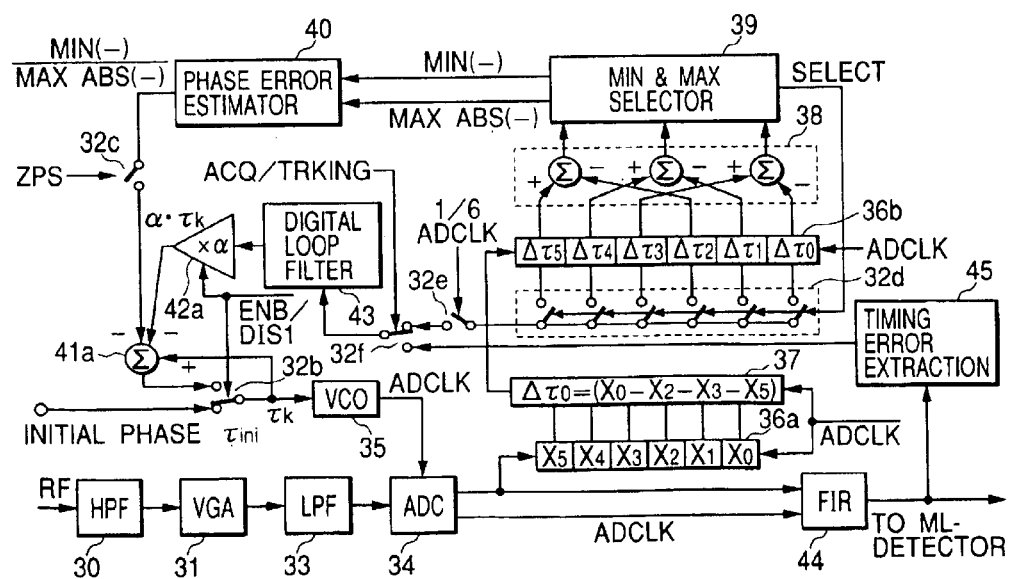
FIG. 3 is a block diagram of a timing control block.
Figure 4:
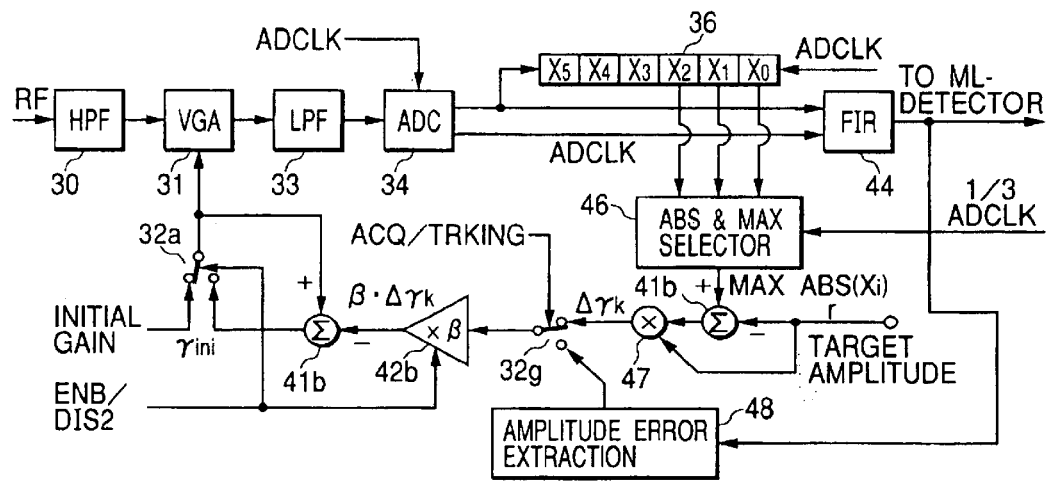
FIG. 4 is a block diagram of an amplitude control block.

When the hard-disk controller 9 issues an instruction to effect data reproduction, the micro processor 11 sends various control signals necessary for data reproduction to the read-write channel 8. The read channel of the read-write channel 8 activates the constituent blocks of the read channel, such as HPF, VGA, LPF, ADC, VCO, etc., in accordance with the control signals. The micro processor 11 feeds the read channel 8 with a gate signal commencing with a preamble 24 and ceasing with an ECC 28 corresponding to data to be reproduced. The gate signal triggers off the reproduction of the data. Referring to FIGS. 3 and 4, which show the configuration of the read channel, a detailed description will follow.

The HPF 30 removes the DC offset from a reproduced signal, which is then input into the VGA 31. An ENB/DIS1 signal and an ENB/DIS2 signal are on the DISABLE sides, and switch 32a sets the gain of the VGA 31 to an initial value $\gamma_{ini}$. The reproduced signal amplified by the VGA 31 is sent to the ADC 34 through the LPF 33. On the other hand, a switch 32b sets the phase of the VCO 35 to an initial value $\tau_{ini}$. The VCO 35 feeds a sampling clock ADCLK to the ADC 34. The reproduced signal amplified by the VGA 31 is sampled by the ADC 34 in accordance with the sampling clock ADCLK.

The sample data taken from the reproduced signal are sent to a six-stage shift register -36a. The sample data $X_5$, $X_3$, $X_2$, and $X_0$ are sent to a timing-gradient computing circuit, 37. The timing-gradient computing circuit 37 is constituted by adders, and the timing gradient $\Delta\tau_0$ of the datum $X_0$ is computed in accordance with an equation, "$X_0-X_2+X_3-X_5$". The timing gradients for the other sample data are computed in the same way. The timing gradients $\Delta\tau_5$ to $\Delta\tau_C$ thus computed are sent to another six-stage shift register 36b, which sends the timing gradients to a subtraction circuit 38. The subtraction circuit 38 does the following subtraction: of $\Delta\tau_5-\Delta\tau_2$, $\Delta\tau_4-\Delta\tau_1$, and $\Delta\tau_3-\Delta\tau_0$, of which the results are output to a maximum and minimum selector 39.

The maximum and minimum selector 39 chooses a remainder with a maximum absolute value and a remainder with a minimum absolute value, the former and the latter being expressed as "max abs (−)" and "min (−)", respectively, which are output to a phase error estimator 40.

The phase error estimator 40 divides "min (−)" by "mas abs (−)" and estimates the phase error between the reproduced signal and the sampling clock ADCLK. The principle of the phase-error estimation will be described below.

It is assumed that the reproduced signal of the 6T-cycle preamble pattern can be approximated by the sine wave. Also the timing gradients at the sampling points can be approximated by the sine wave. Let the timing gradient be equal to "$\sin\{(\Pi/3)(z+\phi)\}$", where "z" stands for the numbers of sample points and "$\phi$" is the phase difference in T's, "T" being the duration of one bit. The timing-gradient differences at the sample points of one cycle of the preamble pattern are $\Delta\tau_0$ to $\Delta X_5$.

$$\Delta\tau_1 \sim \sin\{(\Pi/3)\phi\}$$

$$\Delta\tau_2 \sim \sin\{(\Pi/3)(1+\phi)\}$$

$$\Delta\tau_3 \sim \sin\{(\Pi/3)(2+\phi)\}$$

$$\Delta\tau_4 \sim \sin\{(\Pi/3)(3+\phi)\} = -\Delta\tau_1$$

$$\Delta\tau \sim \sin\{(\Pi/3)(4+\phi)\} = -\Delta\tau_2$$

$$\Delta\tau_6 \sim \sin\{(\Pi/3)(5+\phi)\} = -\Delta\tau_3 \qquad \text{Expression 1}$$

Figure 12:
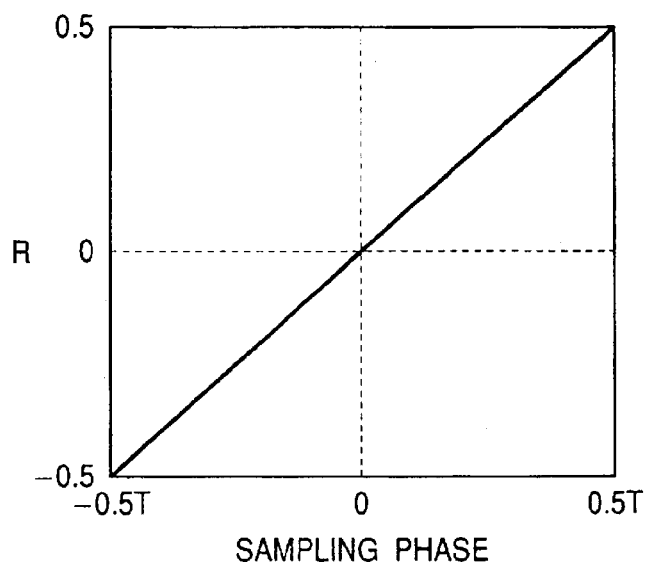
FIG. 12 is a graph which show a correlation between estimated phase difference and actual phase difference.

It is apparent that "$\Delta\tau_1-\Delta\tau_4$" is minimum when the absolute value of "0" is smaller than 0.5, and either "$\Delta\tau_2-\Delta\tau_5$" or "$\Delta\tau_3-\Delta\tau_6$" is maximum. Letting "R" stand for the ratio of "min (−)" to "max abs (−)", it is found that the relation between "$\phi$" and "R" is almost "0:R=1:1" as is shown in FIG. 12.

$$R = \frac{\Delta\tau_1 - \Delta\tau_4}{\max\{abs(\Delta\tau_2 - \Delta\tau_5), abs(\Delta\tau_3 - \Delta\tau_6)\}} \qquad \text{Expression 2}$$

$$= \frac{\sin\{(\pi/3)\phi\}}{\max[abs\sin\{(\pi/3)(1+\phi)\}, abs\sin\{(\pi/3)(2+\phi)\}]}$$

Thus, the phase error of sampling can be estimated by computing the ratio of "mm (−)" to "max abs (−)".

When the ENB/DIS1 signal shifts to the ENABLE side, a loop gain circuit 42a is activated. At the time, the output value of a loop filter 43 is zero, and hence, the output value from the loop gain circuit 42a to an adder 41a remains at zero; therefore, the set value of the phase to be sent from the adder 41a to a VCO 35 through a switch 32a remains unchanged.

Figure 15:
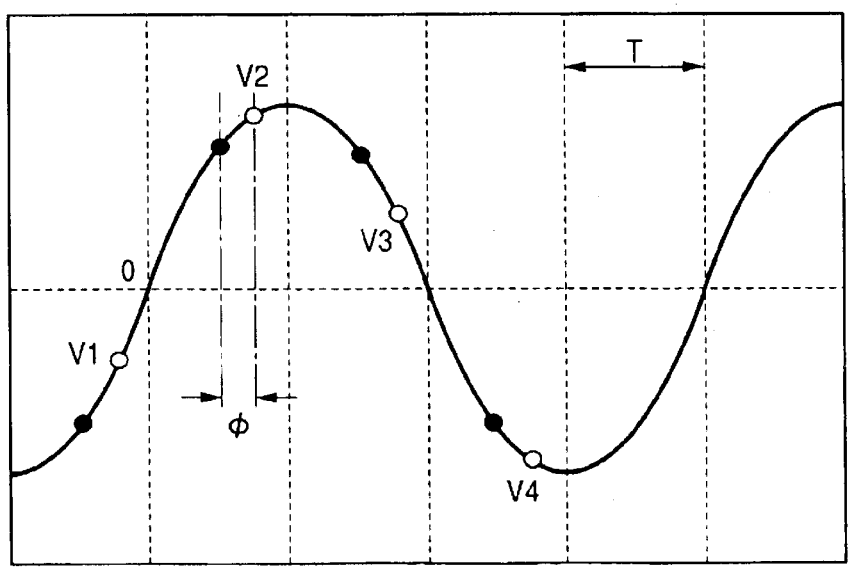
FIG. 15 is a signal diagram which shows an example of a conventional technique in detecting phase difference.
Figure 16:
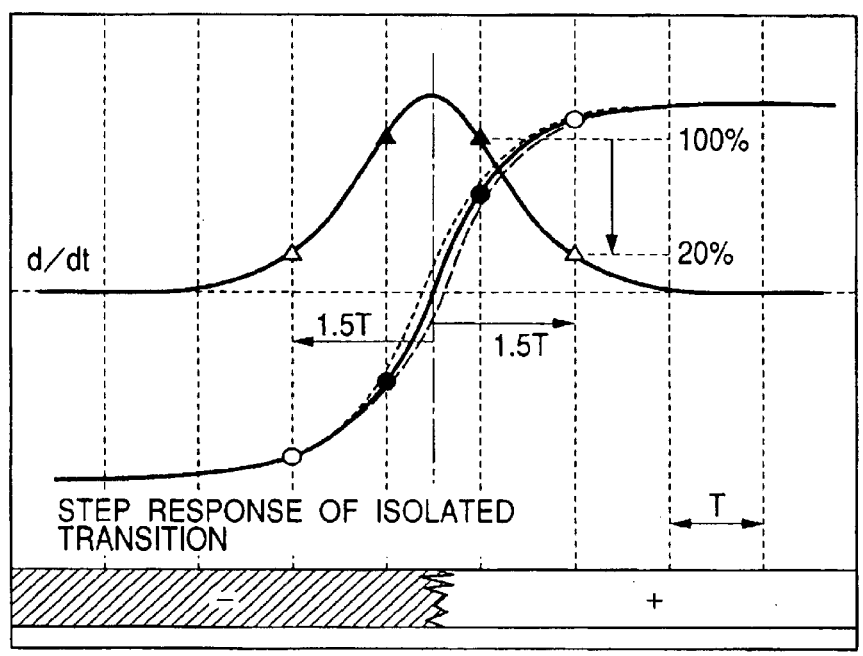
FIG. 16 is a signal diagram which shows effects of jitter-like noise in a channel having a step-type response.

For the purpose of comparison, the principle of phase-error detection in the case of a 4T-cycle preamble pattern will be described (see FIG. 15). The 4T-cycle pattern is expressed by "V(x)=sin (nx/2)", where "x" is the length divided by the bit duration T. Marks, ●, indicate correct sampling points and marks, ○, indicate actual sampling points, which deviate from the correct points by "$\phi$" (normalized by T)". $V_1$ to $V_4$ are the amplitude at the actual sampling points in one cycle.

$$V_1 = -\sin(\Pi/4 - \Pi\phi/2)$$

$$V_2 = \cos(\Pi/4 - \Pi\phi/2)$$

$$V_3 = \sin(\Pi/4 - \Pi\phi/2)$$

$$V_4 = -\cos(\Pi/431\ \Pi\phi/2) \qquad \text{Expression 3}$$

From the above expressions, the phase shift $\phi$ is found as follows.

Figure 18:
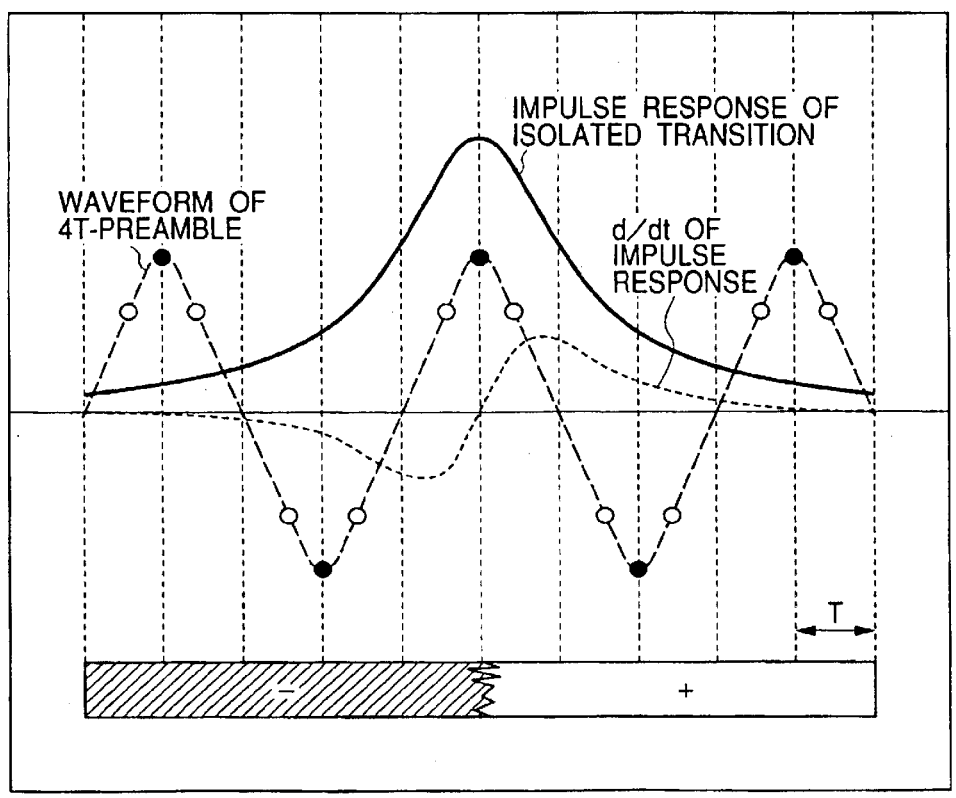
FIG. 18 is a signal diagram which shows effects of jitter-like noise in a channel having an impulse-type response.

Preamble patterns used in hard disk drives will be described next. The output of a MR (magneto-resistive) head of a magnetic-recording channel using a conventional longitudinal magnetic-recording medium shows a band-pass filter characteristic in which DC and high-frequency components fall. The PR4 characteristics are such that when information of "+1" is input, a response of (+1, 0, −1) is output. If "+1" or "−1" is considered to be the direction of magnetization, and if the magnetization pattern of "+1" or "−1" is arranged successively, the output value under the PR4 characteristics is zero. When the direction of magnetization is reversed in the shortest cycle, such as "+1, −1, +1, −1", the output value is again zero. Thus, such output characteristics are suitable to magnetic-recording channels. When the magnetization pattern is "+1, +1, −1, −1", the output is maximum, or "+2, +2, −2, −2". In other words, letting "T" stand for the shortest interval of reversal of magnetization, the output of the 4T-cycle preamble pattern is maximum. Besides, as shown in FIG. 18, the levels of ±2 of a 4T-cycle pattern of the longitudinal magnetic-recording channel is most responsive to the phase shift of sampling. In FIG. 18, the waveform responding to an isolated magnetization transition of the longitudinal magnetic-recording channel is approximated by the Lorentz's waveform, and the peaks of its differentiated waveform is 0.5T to 1.0T away from the point of magnetization transition. On the other hand, the levels of ±2 under the PR4 characteristics are indicated by marks, ○, in FIG. 18. They almost agree in phase with the peak points of the differentiated waveform. Thus, it is most preferable to compute the timing gradients by using the levels of ±2 because the peaks of the differentiated waveform are most responsive to the phase shift of sampling.

After a zero-phase start is accomplished, the system shifts to the acquisition procedure. Because the timing gradients of each cycle of the preamble are computed, the timing of starting the acquisition procedure has to be determined. Because two sampling points, the difference between whose timing gradients is minimum, are found in the process of the zero-phase start, the acquisition procedure is started by making use of the data on the two sampling points. The specific procedure will be described below.

The maximum and minimum selector 39 chooses two timing gradients; for example, $\Delta\tau_4$ and $\neq\tau_1$, the difference betweenwhich is minimum. The directions (plus or minus) of $\Delta\tau_4$ and $\Delta\tau_1$ are different from each other. Assuming that the acquisition procedure is started at the sample point where the direction of the timing gradient is plus and the direction $\Delta\tau_4$ is plus, the maximum and minimum selector 39 sends $\Delta\tau_4$ to the switch 32e by closing one switch of a switch group 32d of the six-stage shift register 36a with a SELECT signal. While the SELECT signal remains as it is until the end of acquisition procedure, $\Delta\tau_{10}$, $\Delta\tau_{16}$, and so on are fed to the switch 32e one after another.

The timing-gradient data of each 6T cycle are sent all at the time from the switch 32e to a switch 32f. The switch 32e is controlled by a 1/6ADCLK. An ACQ/TRKING signal is set to the ACQ side and the output of the switch 32f is sent to the digital loop filter 43 to be averaged. For example, a moving average of four timing-gradient data is taken. The loop gain circuit 42a multiplies the moving average by "α" and feeds it ($\alpha\cdot\Delta\tau_k$) into the adder 41a. The adder 41a subtracts $\alpha\cdot\Delta\tau_k$ from the phase $\tau_k$ and sends the result $\tau_{k+1}$ to the VCO 35.

By repeating the above process, the phase of the ADCLK and that of the reproduced signal are adjusted toward a zero phase shift.

Figure 13:
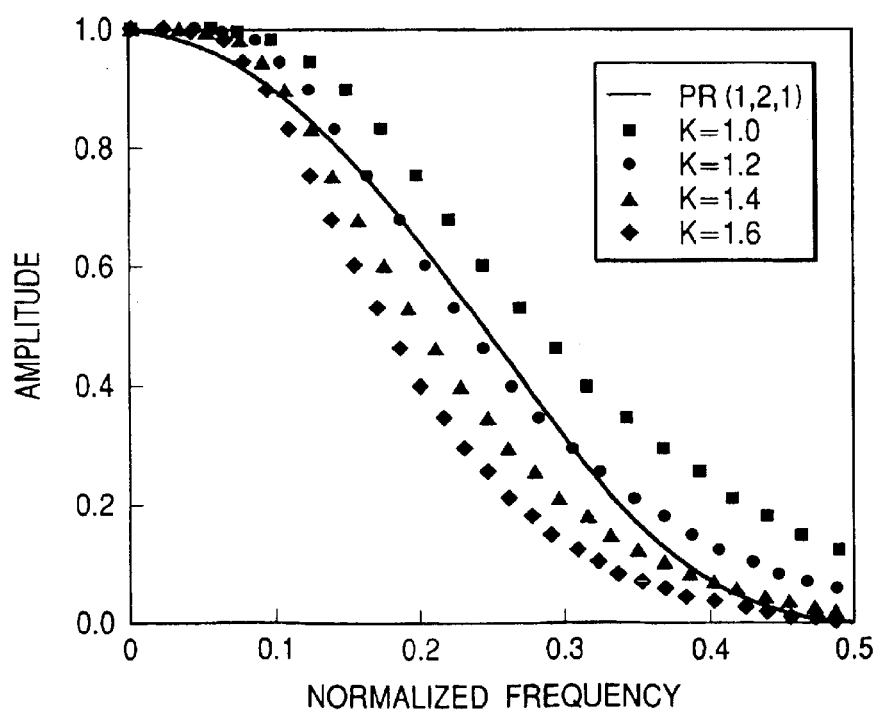
FIG. 13 is a graph which show a reproduction response of a perpendicular magnetic-recording channel.
Figure 14:
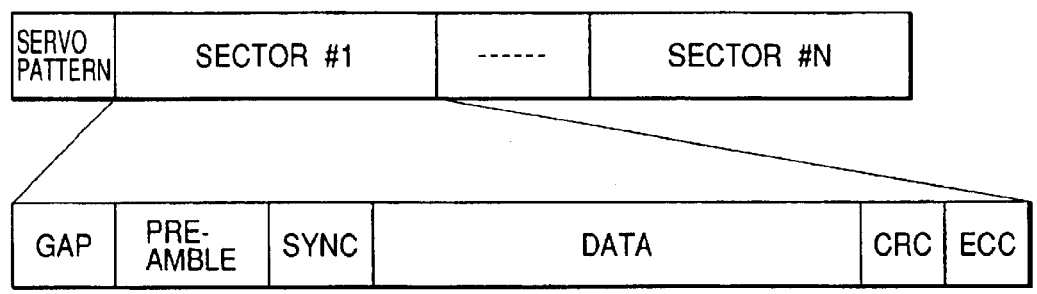
FIG. 14 is a diagram which shows a conventional recording format.

After accomplishing a zero phase shift, the, system proceeds to tracking. Sample data after equalization are tracked. An FIR 44 performs the equalization. The conditions of sample data at the target linear recording density K=1.0–1.4 of the present embodiment are close to PR(1, 2, 1) characteristics, as shown in FIG. 13. Sample data equalized to PR(1, 2, 1) characteristics as target characteristics are fed to a timing error detector 45, which computes the timing gradient by using data judged to have a maximum likelihood by the ML and sends the timing gradient to the switch 32f,. Thereafter, the ACQ/TRKING signal is switched to the TRKING side, and the timing-gradient data is fed from the switch 32f to the digital loop filter 43. The loop gain a of the loop gain circuit 42a is switched to a value-for tracking and the phase setting is renewed.

The process of amplitude adjustment will be described below.

Values $X_2$, $X_1$, and $X_C$ of the sample data $X_5$ to $X_0$ stored in the six-stage shift register 36 are sent to an absolute maximum selector 46. The absolute maximum selector 46 computes the absolute values of $X_2$, $X_1$, and $X_0$ and chooses the maximum value out of the three absolute values. This step is executed for each 3T-cycle by a 1/3ADCLK. It is apparent from the reason to be stated below that the maximum absolute valued "max abs (X)", chosen by the absolute maximum selector 46 is æ the amplitude of the reproduced signal. There are a maximum value and a minimum value in one 6T cycle of the reproduced signal; therefore, the absolute value of one of the three sample data in a half cycle represents the amplitude.

The absolute maximum selector 46 feeds the sample datum with the maximum absolute value into an adder 41b, which computes the difference between the amplitude of the sample datum and the target amplitude r. Thereafter, a multiplier 47 multiplies the difference, "max abs (X)−r", by the target amplitude r. The result, "r{max abs (X)−r}", is the amplitude gradient $\Delta\gamma_k$.

Amplitude control is started when the zero-phase start has been accomplished, the initial phase shift of sample data has been corrected, and the amplitude gradient has been computed from the sample data taken at the corrected timing. At the same time, the ACQ/TRKING signal is switched to the ACQ side.

When the amplitude ,control is started, the ACQ/TRKING signal is switched to the ACQ side and the amplitude gradient $\Delta\gamma_k$ is input into a loop gain circuit 42b through a switch 32g. The loop gain circuit 42b multiplies the amplitude gradient $\Delta\gamma_k$ by a loop gain "β" and the result ts fed into the adder 41b. The adder 41b subtracts $\beta\cdot\Delta\gamma_k$ from the initial gain $_{1ini}$ and sends the result to the switch 32a. At the same time, the ENB/DIS2 signal is switched to the ENABLE side and the new gain value is fed from the switch 32a to the VGA 31. Thereafter, the setting of the gain is renewed once every three sampling times and the acquisition procedure is completed.

After completing the acquisition procedure, the system shifts to tracking. As in the case of phase control, sample data. after equalization are tracked. As in the case of equalization in phase control, the FIR 44 equalizes sample data to the PR(1, 2, 1) characteristics as target characteristics. The sample data after equalization are fed to an amplitude error detector 48, which computes the amplitude gradient by using data judged to have a maximum likelihood by the ML and sends the amplitude gradient to the 41 switch Thereafter, the ACQ/TRKING signal is switched to the TRKING side, and the amplitude gradient is sent from the switch to the loop gain circuit 42b. The loop gain D is switched to a value for tracking and the setting of amplitude is renewed.

Now, the simulation results of the operations of phase and amplitude control of the present first embodiment will be described in detail. A reproduced of perpendicular magnetic recording was synthesized by approximating the waveform responding to an isolated magnetization transition with the hyperbolic tangent function and superposing response waveforms on one another. Conditions concerning the linear recording density and the SN ratio are as follows. Normalized linear recording density K is 1.05 and the resolution of the 1T—1T pattern is 10%. Assuming jitter-like noise to be predominant, white noise and jitter-like, noise were mixed at the ratio of 1:3 in terms of variance. Jitter-like noise was imitated by displacing the point of magnetization transition at random according to the Gaussian distribution. The variance of displacement of the point of magnetization transition was set to 12% of the duration of one bit.

Figure 5:
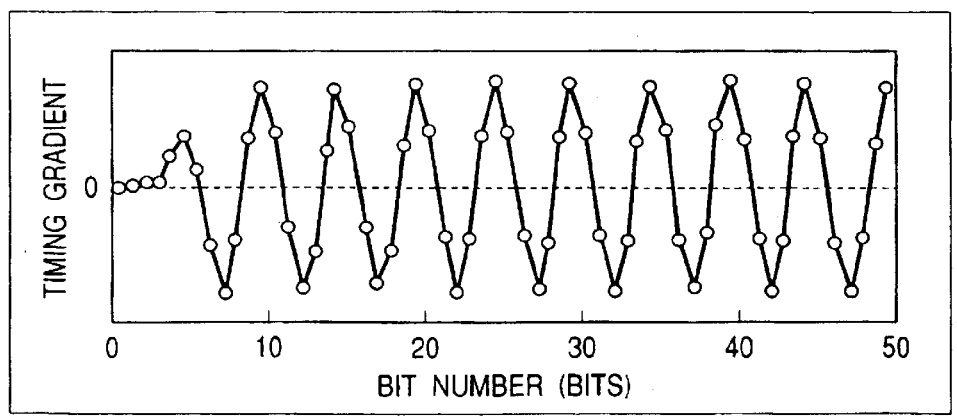
FIG. 5 is a graph showing an example of sampling data of a preamble pattern.
Figure 6A:
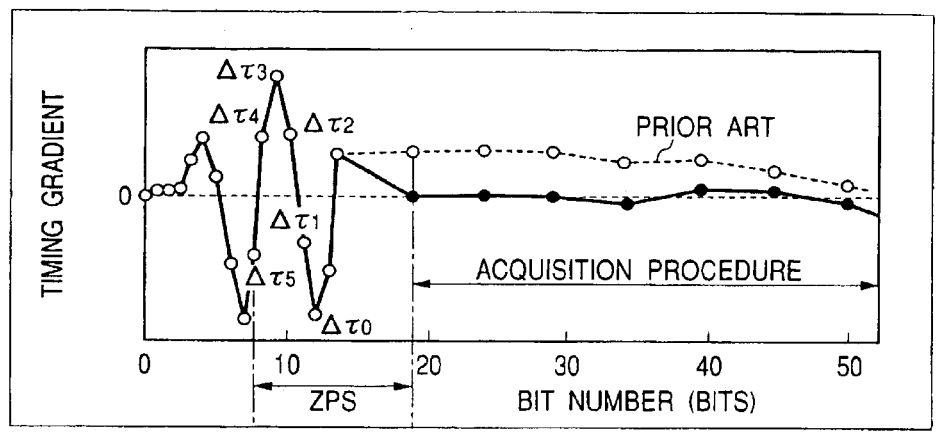
FIGS. 6A and 6B are graphs which show an acquisition procedure of timing control.
Figure 6B:
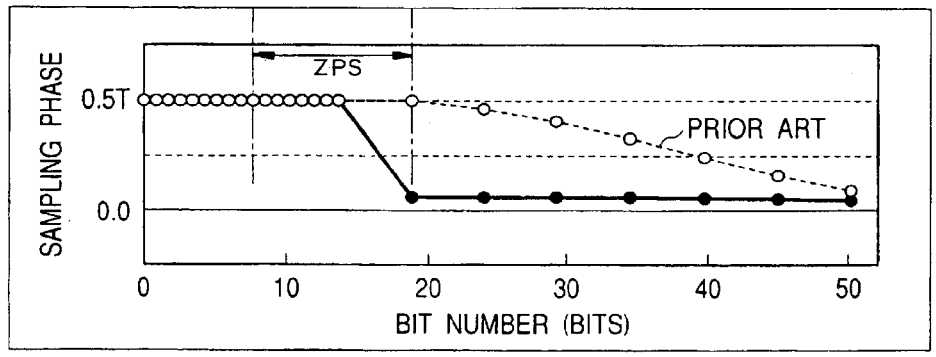

Referring to FIGS. 5, 6A and 6B, the operation of phase control will be described.

FIG. 5 shows computed timing gradients plotted at intervals of the bit duration in the worst case where the phase shift of samples is one half of the duration of one bit. FIG. 6A shows the sample data of FIG. 5 after phase acquisition. In the ZPS (zero-phase start) period, found among $\Delta\tau_5$ to $\Delta\tau_0$ are $\Delta\tau_4$ and $\Delta\tau_1$, which give the minimum timing-gradient difference, and the sampling point of $\Delta\tau_4$ is chosen for the start of acquisition. The phase shift is estimated in the period from $\Delta\tau_4$ to the, sixth sample following $\Delta\tau_4$ and the estimated phase shift is corrected.

As seen from FIG. 6B, adjustment of the phase difference has been completed with an error of about 0.04T in the example. An acquisition procedure, is started at the $12^{th}$ sample counting from $\Delta\tau_4$. A digital loop filter is provided for a moving average of the four timing gradient data, and the loop gain $\alpha$ is determined so that the timing control is completed within the minimum duration with respect to a noiseless signal. Since there have beeii effects of jitter-like noise added to the reproduced signal, and the value of timing gradient is seen to be almost zero, the sampling phase up to 60 bits is hardly renewed (●).

For the purpose of comparison, in FIGS. 6A and 6B, the result (○) when the timing phase is acquired according to conventional art is shown Acquisition of the timing phase is started from the $6^{th}$ sample counting from $\Delta\tau_4$, and there is still a phase error of about 0.1T left even after 60 bits.

Figure 7A:
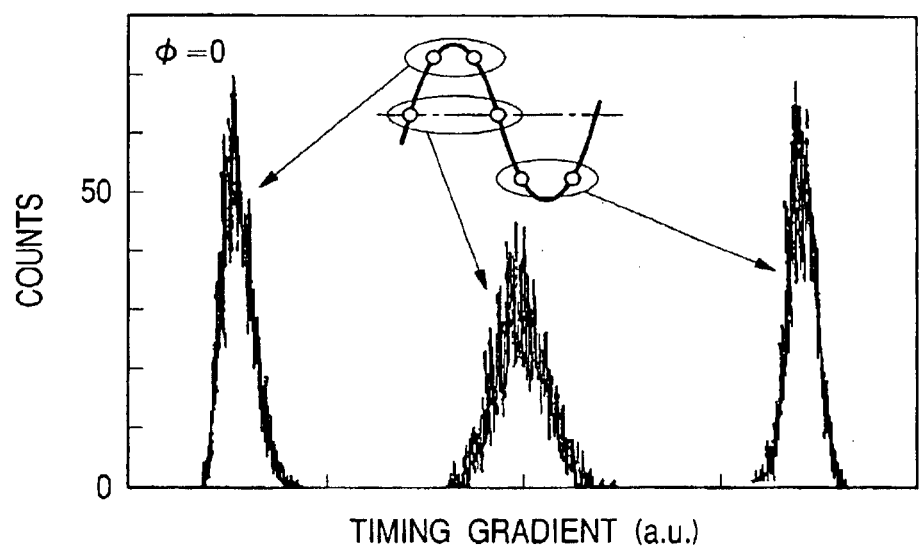
FIGS. 7A and 7B are graphs which show effects of estimating phase difference according to the present invention.
Figure 7B:
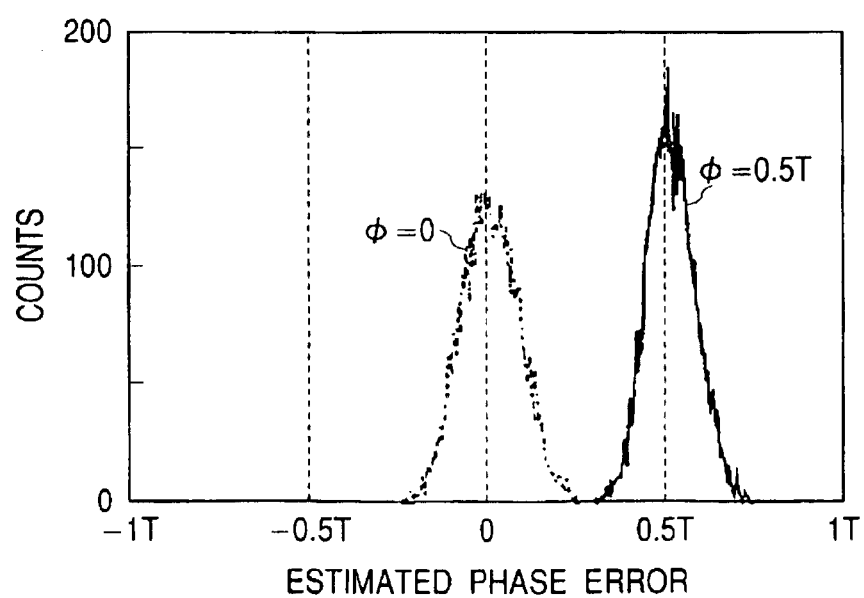

FIGS. 7A and 7B show an estimation distribution when the phase difference estimation according to the present invention is tried repeatedly. The number of tries is 5,300. As jitter-like noise, a shift of the position of a magnetization transition is given by a Gaussian distribution of 12%. FIG. 7A shows a distribution of the timing gradient data when the sampling phase is zero ($\phi$=0). In the case of a 6T-cycle preamble, the timing gradient data turns into at most six distributions. However, when the sampling phase is zero, it is reduced to three distributions. The distribution corresponding to the timing gradient of zero is broad, and we can see that it is significantly affected by jitter-like noise. Based on the timing gradient data showing such a distribution, a result of estimating the phase difference is illustrated in FIG. 7B. When the sampling phase was zero ($\phi$=0), an average value of the estimated phase difference is zero and the variance was 8%. When the sampling-phase is half of a bit duration ($\phi$=0.5T), the variance is about 7%. Namely, the value is somewhat reduced compared with the value when $\phi$=0. Considering that the variance of the shift of a position of a magnetization transition is reflected as it is in the phase error, when using a conventional "zero-phase start" method and sampling timing of the edge by a zero-cross comparator, etc., variation of the phase setting by the zero-phase start method of the present embodiment is reduced to 58%–67% in comparison with the conventional method.

In order to further improve the estimation variation according to the phase estimation method of the present invention, the estimation may be repeated several times for taking the average. For example, an estimation variation is reduced to $1/\sqrt{2}$ by two tries, and the same is reduced to ½ by four tries. Further, judging from the fact-that the estimation variation is smaller in the case when a sampling phase is 0.5T, it is advantageous to set the target value of the phase difference estimation to 0.5T from the viewpoint of dispersion. In this case, a feed back loop of making the sampling phase 0.5T from an acquisition procedure. to tracking is used However, the phase difference of 0.5T is dealt with by altering a coefficient of the FIR filter of the later step.

Figure 8A:
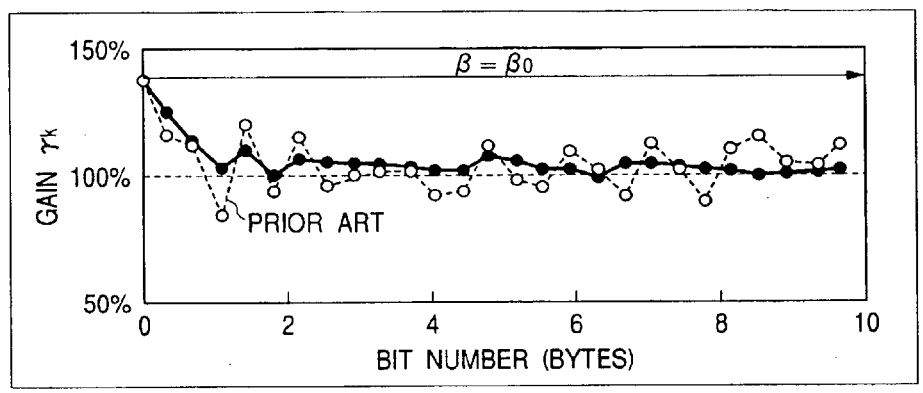
FIGS. 8A and 8B are graphs which show an acquisition procedure of amplitude control.
Figure 8B:
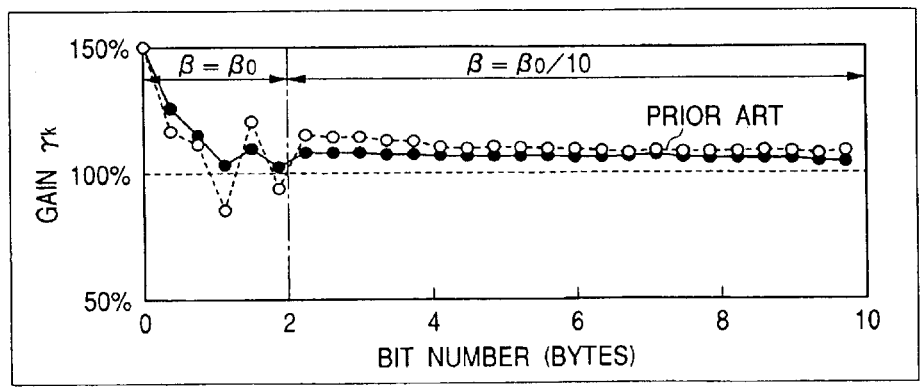

FIGS. 8A and 8B show an example of the operation of amplitude control. A simulation is made on condition that a gain of 150% is expected when the target gain is 100%. Further, "zero phase start" was considered as a prerequisite, and it was assumed that there was no sampling phase difference. A loop gain $\beta$ is determined so that it converges on the target gain by 2 bytes of preamble pattern and so that the variance of the set gain becomes minimum.

FIG. 8A shows a case when the loop gain is fixed, and FIG. 8B shows a case when the loop gain is lowered to one-tenth after the initial acquisition of 2 bytes. A comparison was made between a case wherein sample data of a peak point of the preamble pattern is used (●) and a case wherein sample data before and after the peak point are used (○). The latter is the equivalent of the case wherein a conventional 4T-cycle preamble pattern is used. Apparently, the gain set point of the latter varies significantly. The variance of the gain value by a conventional method is about 5% in terms of byte, while it is 1.6% in byte according to the present invention using a peak point. Namely, it is reduced to one-third of that of the conventional method.

Such effects of reduction in the variance are seen prominently during transition from an acquisition procedu.re to tracking. In FIG. 8B, since heavy jitter-like noise is caused upon lowering the loop gain to one-tenth of what it used to be after the initial acquisition, the gain setting is widely varied. The gain setting error of the present invention right after the acquisition is 7%, while the same according to the conventional method is 15%. Since the initial gain setting error when starting the tracking is large, the error. is finally reduced to 8% at the point of 10 bytes by the conventional method. The size of the gain setting error is almost the same as that of the gain setting error right after the acquisition procedure of the present invention. According to the present invention, the gain setting error is reduced to about 4% at the point of 10 bytes, which is evidently superior to the conventional method.

Second Embodiment

A hard disk drive, with a perpendicular-recording magnetic medium taken as an example, representing a second embodiment will be described. In the first embodiment, repetition patterns such as 1T—1T are recorded all over the sector. The purpose of this is to prevent the spectrum of lower frequency seen in channel characteristics of the perpendicular magnetic recording from causing an unfavorable transit response in the reproduced signal after passing through the high-pass filter. In the second embodiment, when the magnetization is fixed either in the direction of plus or minus by eliminating direct current, a means to adjust effects of the spectrum of lower frequency is provided.

Figure 9A:
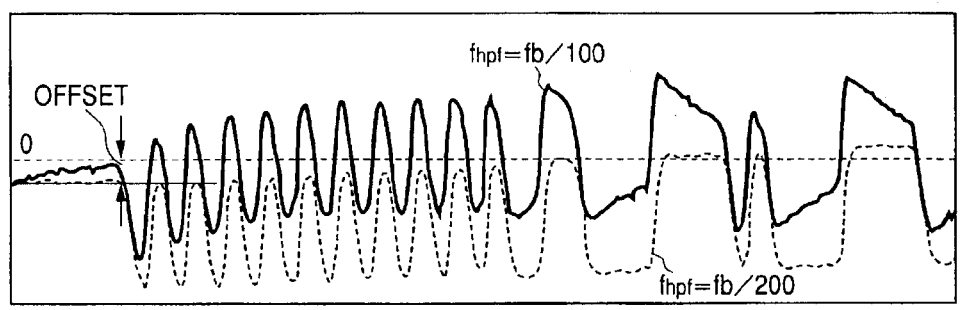
FIGS. 9A and 9B are graphs which show effects of a high-pass filter and a direct-current reproduction method.

In FIG. 9A, a reproduced signal, when a high-pass filter having cutoff frequencies of fb/100 and fb/2000 is applied, is compared with a clock frequency fb (=1/T; T is the duration of one bit). An offset voltage is also added to, the reproduced signal before it is passed through the high-pass filter. In the cutoff frequency of fb/2000, though distortion is not caused in the reproduced-signal waveform, the reproduced signal is significantly offset as a whole with respect to zero. On the contrary, when the cutoff, frequency is made to be fb/100, which is twenty times as much as it used to be, the offset is promptly eliminated. However, the distortion is still left in the reproduced signal. Thus, in a channel having a spectrum of lower frequency, it is generally difficult to reduce both the transient response and the waveform distortion.

Figure 9B:
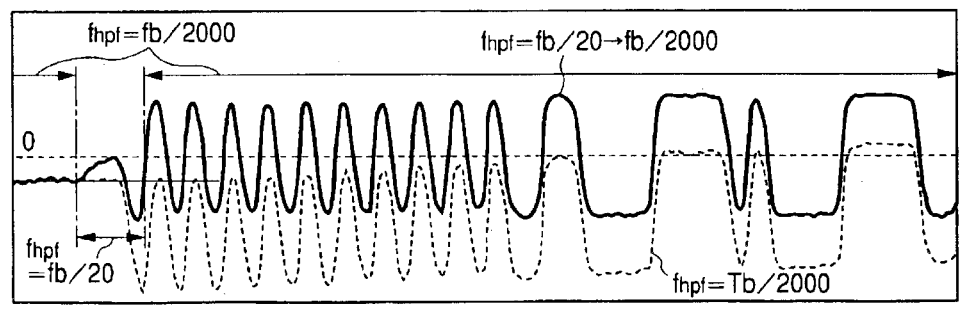

To cope with this problem, as shown in FIG. 9B, it is effective to switch the cutoff frequency of the high-pass filter at high speed at the head of the data. The waveform indicated by a solid line shows a case wherein a DC level is eliminated by keeping the cutoff frequency of the high-pass filter at fb/20 for a certain period, and then switching the cutoff frequency to fb/2000, which is 100 times as much as it used to be. It is found that, though waveform distortion Is seen in a region of the cutoff frequency of fb/20, the later waveform is not affected by the distortion and the DC level all over the signal is effectively eliminated.

In order to achieve the above-described operation in a read channel, the HPF is provided with a function to vary the cutoff frequency at high speed. To be more specific, the HPF is comprised of a primary filter including a condenser and a plurality of resistors. The switching of the cutoff frequency is carried out by changing the set value of the resistor. When a microprocessor sends a reproduced gate signal to a read-write channel, the reproduced gate signal triggers off the setting of the cutoff frequency at, for example, about fb/20 for a certain period. At this time, a range of the certain period is selectable, and then, the read channel switches the cutoff frequency to fb/2000. As a result, the DC voltage of the reproduced signal becomes zero.

Except for high-speed switching of the cutoff frequency of the high-pass filter, the operations are the same as those in the first embodiment and the description for them is omitted.

Third Embodiment

Figure 10:
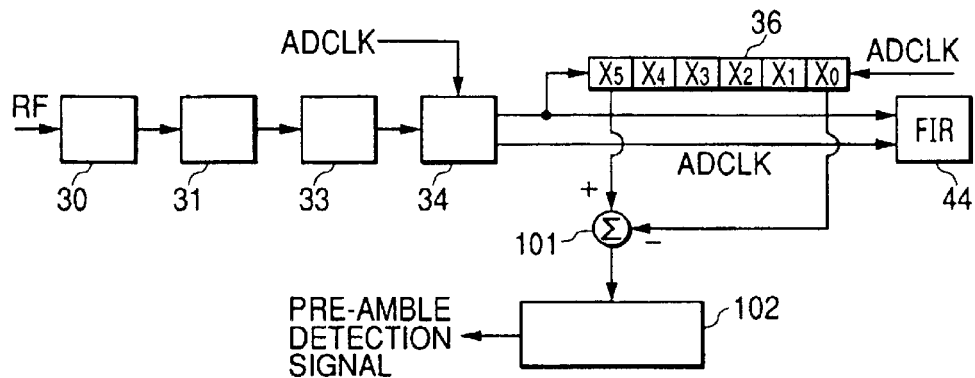
FIG. 10 is a schematic circuit diagram of a circuit used for detecting a head of a preamble pattern.
Figure 11A:
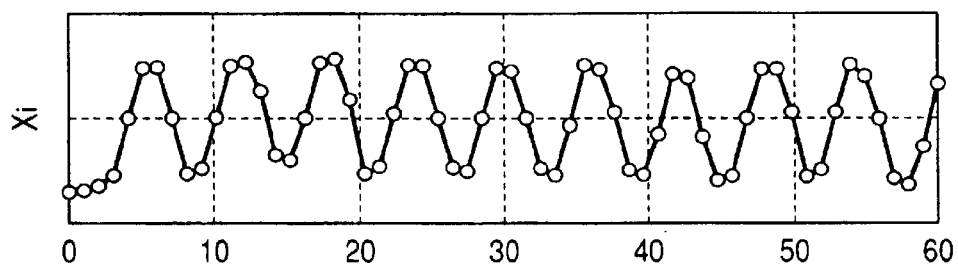
FIGS. 11A and 11B are graphs which show a principle for detecting the head of the preamble pattern.
Figure 11B:
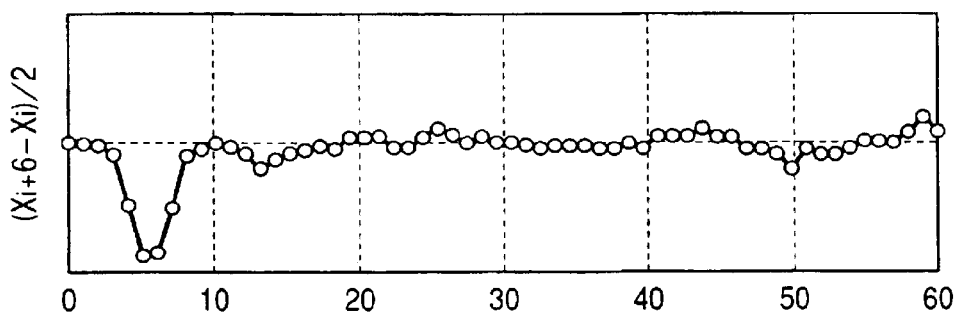

A hard disk drive, with a perpendicular-recording magnetic medium taken as an example, representing a third embodiment, will be described. The present embodiment is different from the above-described first and second embodiments in that the read channel is provided with a function to detect the timing of the beginning of a preamble based on the sampled data. This function is particularly important from a viewpoint of failsafe operation. Since the read channel reproduces data at the command of a host controller, a malfunction and so on cannot occur so long as various control timing signals are supplied at an appropriate timing. However, if the timing of the read gate signal is shifted, the operations of timing and amplitude control are started at a point out of a preamble region, or the operations come into the latter half of the preamble, causing the start of SYNC and data reproduction in a state where acquisition has not been fully completed. The present embodiment is intended to detect the start point of a preamble from sampled data by making use of the periodicity of the preamble. Referring to FIGS. 10, 11A and 11B, a specific method will be described.

FIG. 11A shows sample data $\{X_1\}$ at the beginning of the region of a 6T-cycle preamble pattern. In this example, there is no phase shift of sampling. When sample data in FIG. 11A is displaced by 6 samples and subtraction of $(X_i+6-X_i)/2$ is carried out, as shown in FIG. 11B, all the data except for sample data of one cycle from the head are cancelled. This is because the preamble has a 6T-periodicity. Even when the sampling phase is not zero, the same peak data can be obtained. By detecting a peak from the peak data obtained, in this manner, the timing of the head of the preamble is obtained.

A specific circuit to be used for the above detection of the head of the preamble is shown in FIG. 10.

In order to obtain sample data 6 samples away for the subtraction, a 6-stage shift register 36 is utilized. After sample data of $X_5$ and $X_0$ are fed to an adder 101, and subtraction is carried out, a peak timing is determined by the peak detector 102.

When a read gate signal comes after the peak timing, the read channel starts, reproducing data with such a peak &timing. The same event occurs even when there is no command of reproduction. Therefore, when a read gate signal is not sent within a given time from the peak timing, the data reproduction operation is stopped at that point. On the contrary, when the read gate signal arrives earlier than the peak timing, the operation is held until the detection of the peak timing is made sure.

Fourth Embodiment

Figure 17:
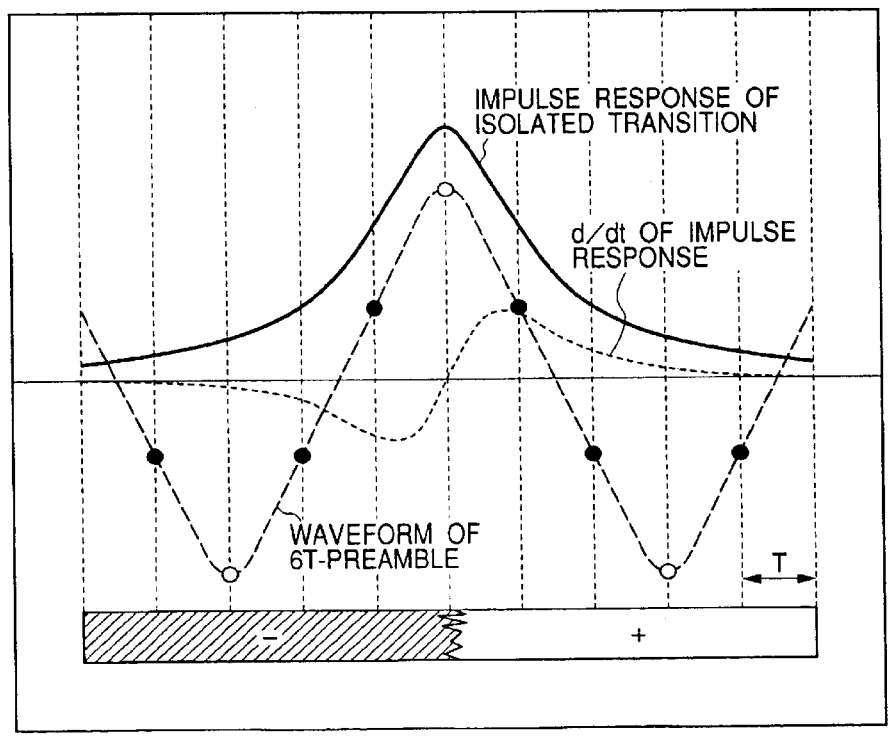
FIG. 17 is a signal diagram shows a third embodiment.

Referring to FIG. 17, a hard disk drive, with a conventional longitudinal magnetic recording medium taken as an example, representing a fourth embodiment of the invention, will be explained.

A 6T-cycle preamble pattern is used also in the present embodiment. In FIG. 17, a reproduced signal of the 6T-cycle preamble pattern is shown by a broken line. ○ and ● in FIG. 17 show amplitude data sampled with T, which is the duration of one bit. The amplitude data of ○ coincides with a position of a magnetization transition. Since a differentiated waveform of an impulse response of the isolated magnetization transition becomes zero, the amplitude data is least sensitive to a shift of the position of the magnetization transition, and is least affected by jitter-like noise. Amplitude adjustment is carried out by using the amplitude data of ○. The specific flow of adjustment is the same as that of the first and second embodiments; therefore the description thereof in detail is omitted. On the other hand, the amplitude data of ● is used for timing control. Since the differentiated waveform of the impulse response of the isolated magnetization transition is almost at the maximum point, it is amplitude data preferable for detecting a shift of sampling timing. However, since it is most sensitive to the shift of a position of a magnetization transition, it is easily affected by jitter-like noise. Therefore, a zero-phase start operation, an acquisition procedure and tracking like those in the above first and second embodiments are carried out. Though a detailed description is omitted, since the sampling phase in FIG. 17 is shifted from the phase of the original PR4 by 0.5T, the tap coefficient is determined by considering, the shift of 0.5T of the phase in F1R44. Further, an equalization target in tracking is to be one having band-pass filter characteristics, such as PR4 characteristics.

In the above described embodiments, hard disk drives are taken as examples. However, it is needless to say that the present invention is similarly effective in optical disk devices, including DVDs.

Even when jitter-like noise is predominant as noise to be added to a magnetic recording channel, it becomes possible to perform the timing and amplitude control with the same accuracy as the conventional one without increasing the number of bits to be allotted to the preamble pattern.

What is claimed is:

1. A magnetic recording system comprising:

a magnetic-recording medium with data sectors wherein a preamble pattern of a prescribed cycle is recorded;

a magnetic head to reproduce the preamble pattern; and a signal-processing circuit to-process data to be recorded in and reproduced from the data sectors, the cycle of the preamble pattern being 6T or longer, T standing for minimum duration of data-recorded bits in the data sectors, and the signal-processing circuit including (i) a means for sampling a signal reproduced from the preamble pattern and (ii) a means for correcting the amplitude by using maximum and minimum amplitude values in each cycle of the preamble pattern sampled by the sampling means.

2. A magnetic recording system comprising:

a magnetic-recording medium with data sectors wherein a preamble pattern of a prescribed cycle is recorded;

a magnetic head to reproduce the preamble pattern; and a signal-processing circuit to process data to be recorded in and reproduced from the data sectors, the signal-processing circuit including (i) a means for sampling a signal reproduced from the preamble pattern, (ii) a means for computing timing gradients proportionate to phase shifts of sampling by using amplitude values taken by the sampling means, and (iii) a means for estimating the phase shift of sampling by using the timing gradients.

3. A magnetic recording system as claimed in claim 2, wherein the cycle of the preamble pattern is 6T or longer, T standing for minimum duration of data-recorded bits in the data sectors.

4. A magnetic recording system as claimed in claim 1, wherein a repetitive pattern whose cycle is shorter than 6T is recorded in a region between each data sector and a servo-pattern region.

5. A signal-processing circuit comprising:

a means for sampling a signal reproduced from a preamble pattern;

a means for computing timing gradients proportionate to phase shifts of sampling by using amplitude values taken by the sampling means; and a means for estimating the phase shift of sampling by using the timing gradients.

6. A signal-processing circuit as claimed in claim 5, wherein:

the means for computing timing gradients computes 2N timing gradients based on 2N amplitude values taken by sampling at intervals T, the cycle of the preamble pattern being 2NT, N being an integer of three or larger, T being the duration of one bit; and the means for estimating the phase shift includes (i) a means for subtracting each timing gradient from the N-th timing gradient after said timing gradient, (ii) a means for choosing two remainders of maximum and minimum absolute values out of N remainders after the subtraction, and (iii) a means for dividing the remainder of the minimum absolute value by the remainder of the maximum absolute value.

7. A signal-processing circuit as claimed in claim 5, further comprising:

a means for delaying, by the cycle of the preamble pattern, first amplitude data taken by sampling a signal reproduced from the preamble pattern at intervals of T to obtain second amplitude data;

a means for subtracting the second amplitude data from the first amplitude data; and a means for determining the timing of the head of the preamble pattern based on the remainders after the subtraction.

8. A signal-processing circuit as claimed in claim 5, further comprising:

a means for adjusting the phase shift of sampling based on timing gradients computed by the means for computing them;

a means for computing the difference between target amplitude and amplitude determined based on amplitude data obtained by the sampling means; and a means for correcting the difference obtained by the means for computing the difference.

9. A signal-processing circuit as claimed in claim 5, wherein the phase shift of sampling is adjusted to one half of the duration of one bit.

* * * * *